United States Patent
Kemper et al.

(10) Patent No.: US 9,235,113 B2
(45) Date of Patent: *Jan. 12, 2016

(54) LITHOGRAPHIC APPARATUS AND DEVICE MANUFACTURING METHOD

(75) Inventors: Nicolaas Rudolf Kemper, Eindhoven (NL); Sjoerd Nicolaas Lambertus Donders, Vught (NL); Joost Jeroen Ottens, Veldhoven (NL); Edwin Cornelis Kadijk, Eindhoven (NL); Sergei Shulepov, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 1113 days.

This patent is subject to a terminal disclaimer.

(21) Appl. No.: 13/149,121

(22) Filed: May 31, 2011

(65) Prior Publication Data

US 2011/0242512 A1   Oct. 6, 2011

Related U.S. Application Data

(63) Continuation of application No. 11/390,427, filed on Mar. 28, 2006, now Pat. No. 8,027,019.

(51) Int. Cl.
  *G03B 27/52* (2006.01)
  *G03B 27/42* (2006.01)
  *G03F 7/20* (2006.01)

(52) U.S. Cl.
  CPC ............ *G03B 27/42* (2013.01); *G03F 7/70341* (2013.01); *G03F 7/70716* (2013.01)

(58) Field of Classification Search
  CPC ............ G03F 7/70341; G03F 7/70716; G03F 7/2041; G03F 7/20; G03F 7/707; G03F 7/70325; G03F 7/70825

USPC ................................................ 355/30, 53, 62
See application file for complete search history.

(56) References Cited

U.S. PATENT DOCUMENTS

| | | | |
|---|---|---|---|
| 4,509,852 | A | 4/1985 | Tabarelli et al. |
| 6,766,817 | B2 | 7/2004 | da Silva |
| 6,918,404 | B2 | 7/2005 | da Silva |
| 7,066,586 | B2 | 6/2006 | da Silva |

(Continued)

FOREIGN PATENT DOCUMENTS

| | | |
|---|---|---|
| CN | 1501175 | 6/2004 |
| CN | 1700098 | 11/2005 |

(Continued)

OTHER PUBLICATIONS

Japanese Office Action mailed May 7, 2012 in corresponding Japanese Patent Application No. 2010-118223.

(Continued)

*Primary Examiner* — Mesfin T Asfaw
(74) *Attorney, Agent, or Firm* — Pillsbury Winthrop Shaw Pittman LLP

(57) ABSTRACT

Embodiments of a drain in a lithographic projection apparatus are described that have, for example, a feature which reduces inflow of gas into the drain during a period when no liquid is present in the drain. In one example, a passive liquid removal mechanism is provided such that the pressure of gas in the drain is equal to the ambient gas pressure and in another embodiment a flap is provided to close off a chamber during times when no liquid needs removing.

27 Claims, 6 Drawing Sheets

(56) References Cited

U.S. PATENT DOCUMENTS

| | | | |
|---|---|---|---|
| 7,199,858 B2 | 4/2007 | Lof et al. | |
| 7,528,929 B2 | 5/2009 | Streefkerk et al. | |
| 7,602,470 B2 | 10/2009 | Kemper et al. | |
| 7,616,383 B2 | 11/2009 | Streefkerk et al. | |
| 7,839,483 B2 | 11/2010 | Leenders et al. | |
| 7,898,642 B2 | 3/2011 | Kolesnychenko et al. | |
| 8,027,019 B2 | 9/2011 | Kemper et al. | |
| 2004/0136494 A1 | 7/2004 | Lof et al. | |
| 2004/0160582 A1* | 8/2004 | Lof et al. | 355/30 |
| 2004/0189964 A1 | 9/2004 | Nijmeijer et al. | |
| 2004/0207824 A1 | 10/2004 | Lof et al. | |
| 2005/0078287 A1 | 4/2005 | Sengers et al. | |
| 2005/0175776 A1 | 8/2005 | Streefkerk et al. | |
| 2005/0219488 A1 | 10/2005 | Nei et al. | |
| 2005/0231694 A1 | 10/2005 | Kolesnychenko et al. | |
| 2005/0259232 A1 | 11/2005 | Streefkerk et al. | |
| 2005/0264778 A1 | 12/2005 | Lof et al. | |
| 2006/0033894 A1 | 2/2006 | Binnard | |
| 2006/0087630 A1 | 4/2006 | Kemper et al. | |
| 2006/0139614 A1 | 6/2006 | Owa et al. | |
| 2007/0115450 A1 | 5/2007 | Nagasaka et al. | |
| 2007/0146666 A1* | 6/2007 | Leenders et al. | 355/53 |
| 2008/0111978 A1 | 5/2008 | Shibuta | |
| 2010/0271606 A1 | 10/2010 | Sanderse et al. | |

FOREIGN PATENT DOCUMENTS

| | | |
|---|---|---|
| EP | 1 420 300 A2 | 11/2003 |
| EP | 1 429 188 A2 | 6/2004 |
| EP | 1 420 300 A3 | 8/2005 |
| EP | 1 571 695 A1 | 9/2005 |
| EP | 1 628 163 A2 | 2/2006 |
| EP | 1 628 163 A3 | 2/2006 |
| EP | 1 699 073 A1 | 9/2006 |
| JP | 2004-289127 | 10/2004 |
| JP | 2005-005707 | 1/2005 |
| JP | 2005-101488 | 4/2005 |
| JP | 2005-191557 | 7/2005 |
| JP | 2006-060223 | 3/2006 |
| JP | 2006-295150 | 10/2006 |
| JP | 2007-235112 | 9/2007 |
| TW | 200604755 | 2/2006 |
| WO | WO99/49504 | 9/1999 |
| WO | 2004/112108 | 12/2004 |
| WO | 2005/057636 | 6/2005 |

OTHER PUBLICATIONS

Japanese Office Action mailed May 31, 2013 in corresponding Japanese Patent Application No. 2010-118223.

English Translation of Japanese Office Action for Japanese Patent Application No. 2007-072118, mailed Feb. 23, 2010.

Taiwan Office Action dated Mar. 24, 2014 in corresponding Taiwan Patent Application No. 100142435.

U.S. Office Action dated Jul. 22, 2014 in corresponding U.S. Appl. No. 13/187,055.

U.S. Office Action dated Mar. 2, 2015 in corresponding U.S. Appl. No. 13/187,055.

\* cited by examiner

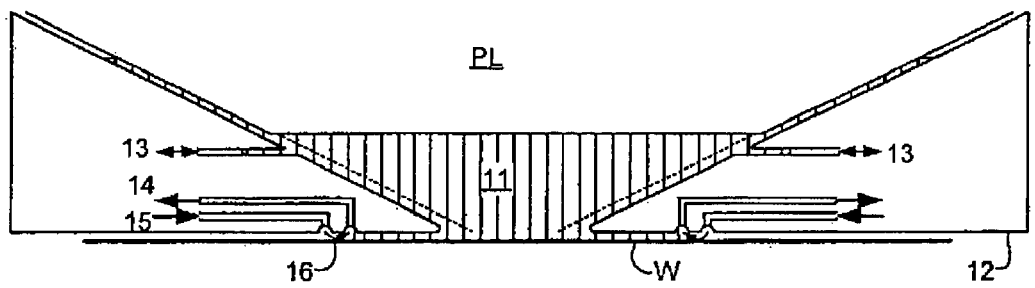
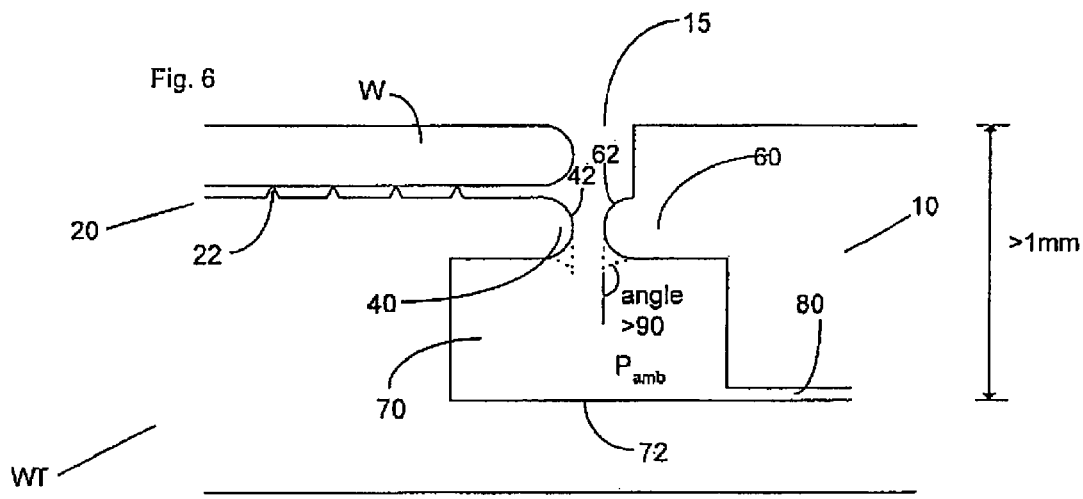
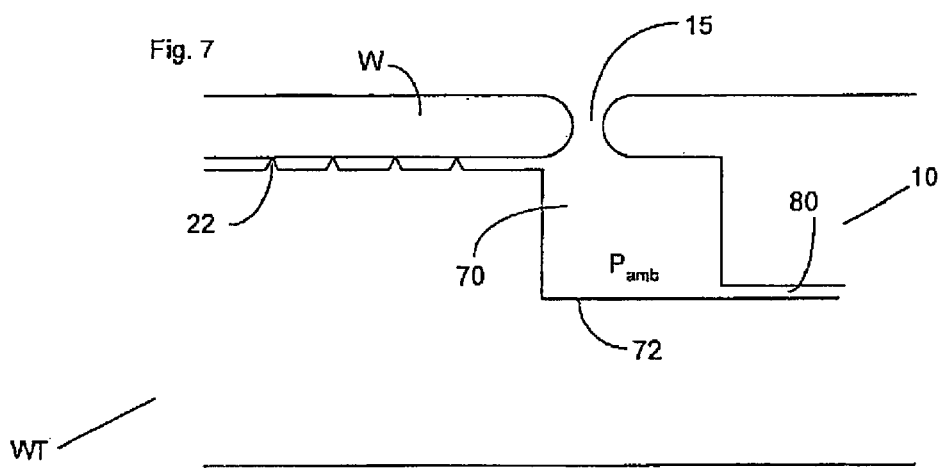

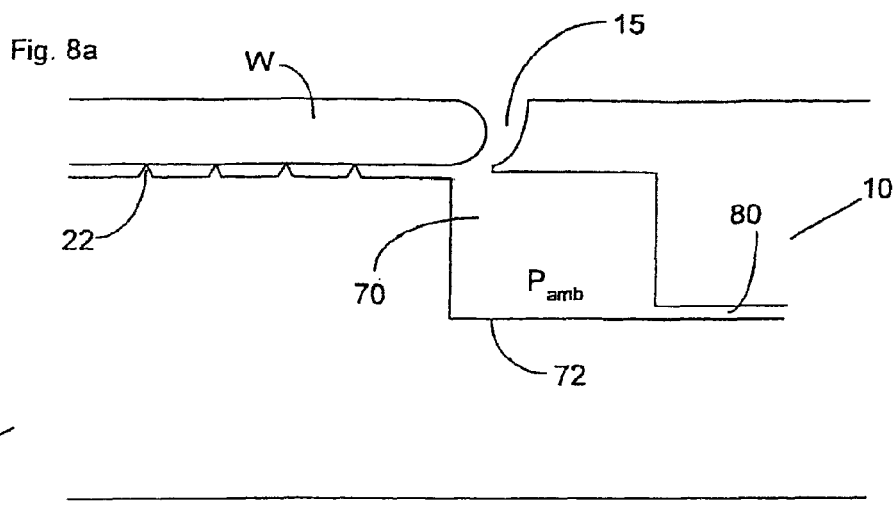
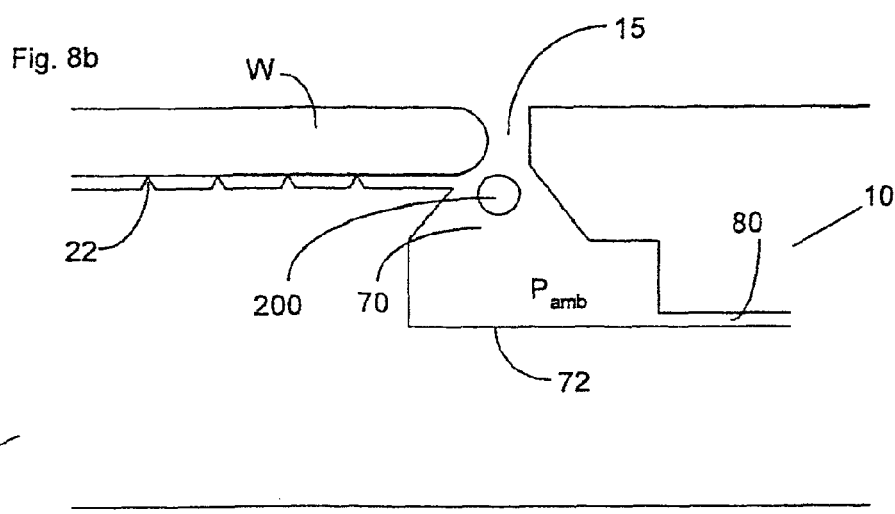
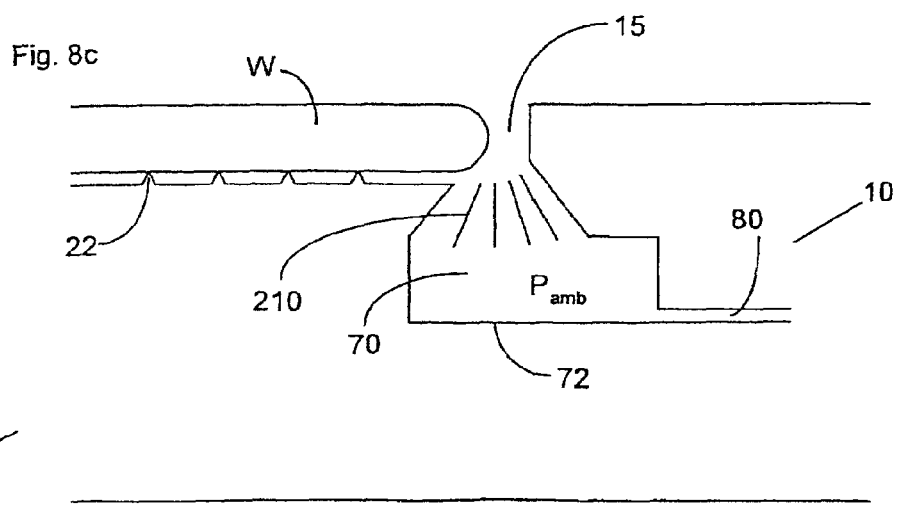

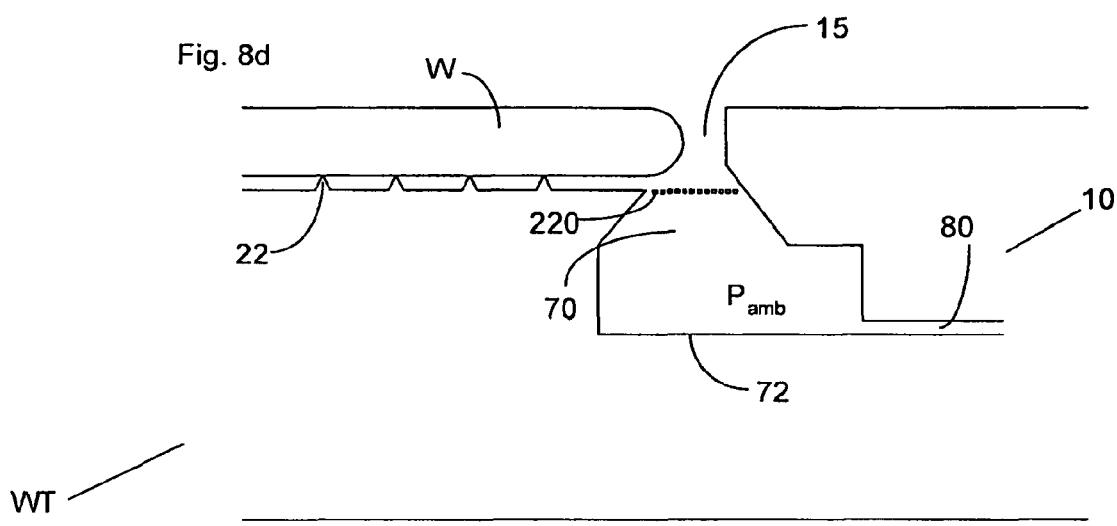
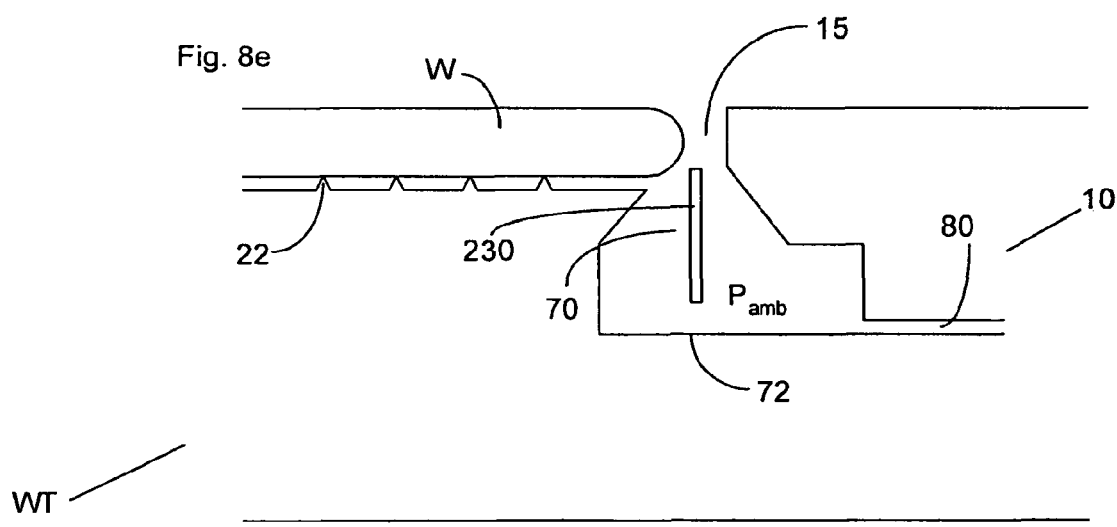

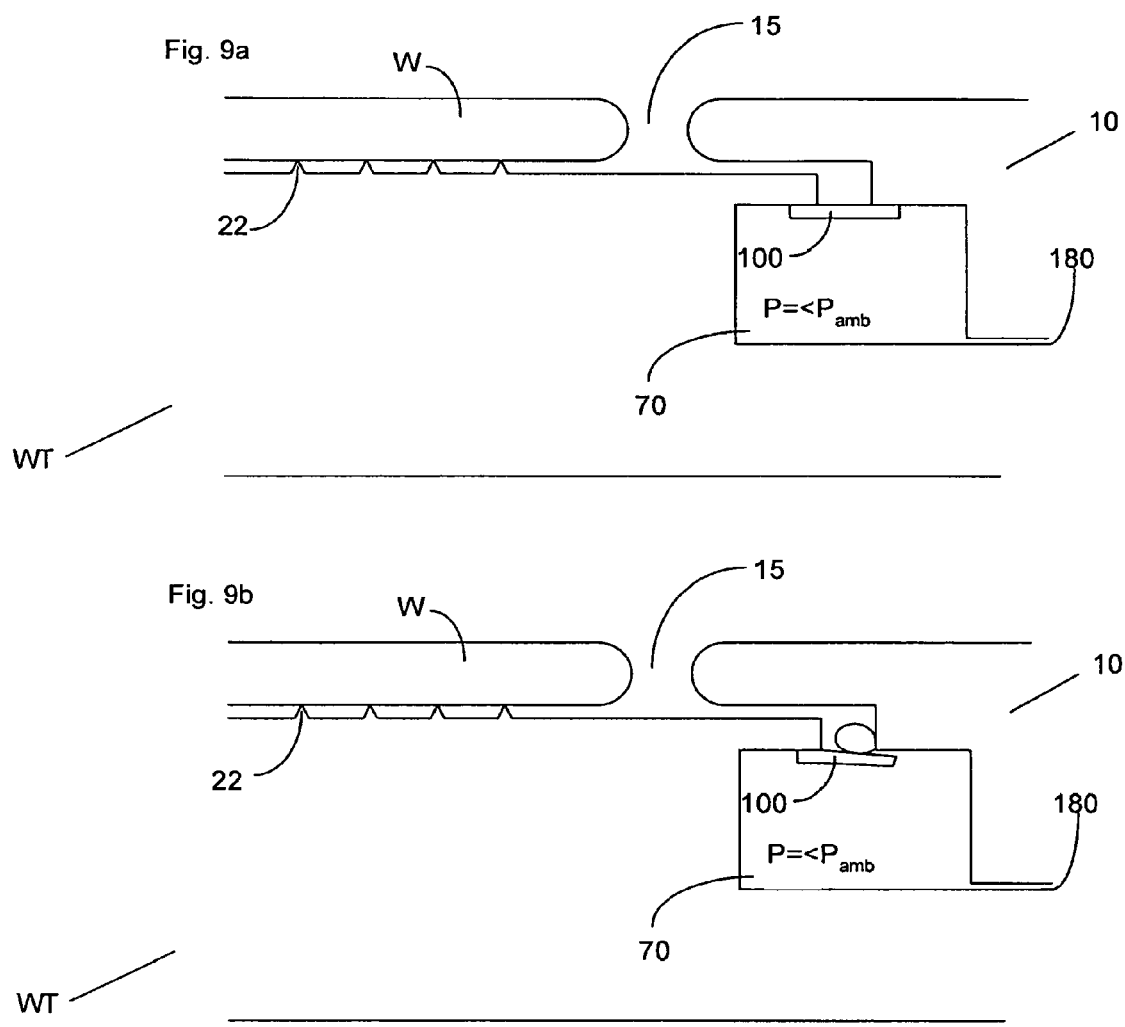

LITHOGRAPHIC APPARATUS AND DEVICE MANUFACTURING METHOD

This is application is a continuation of U.S. patent application Ser. No. 11/390,427, filed Mar. 28, 2006, now U.S. Pat. No. 8,027,019 the entire contents of the foregoing application incorporated herein by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Handling immersion liquid in a lithographic apparatus brings with it one or more problems of liquid handling. A gap normally exists between an object, such as a substrate and/or a sensor, and a substrate table around the edge of the object (e.g., substrate). U.S. patent application publication US 2005-0264778, herein incorporated in its entirety by reference, discloses filling that gap with material or providing a liquid source or low pressure source to deliberately fill the gap with liquid in order to avoid bubble inclusion as the gap passes under the liquid supply system and/or to remove any liquid which does enter the gap.

SUMMARY

It is desirable, for example, to provide for removal of liquid from a gap between an edge of an object and a substrate table on which the object is positioned. The object may be a substrate, a sensor, a closing plate, etc.

According to an aspect of the invention, there is provided a lithographic apparatus, comprising a substrate table constructed to hold a substrate; a liquid supply system configured to provide a liquid to a space between an object on the substrate table and a projection system; and a drain in the substrate table configured to contain liquid which leaks, in use, between an edge of the object and the substrate table, wherein, in use, pressure of gas in the drain is maintained to be substantially equal to ambient pressure of gas above the substrate table.

According to an aspect of the invention, there is provided a lithographic apparatus, comprising a substrate table constructed to hold a substrate; a liquid supply system configured to provide a liquid to a space between an object on the substrate table and a projection system; and a chamber in the substrate table in fluid communication with a gap surrounding, in use, an outer edge of the object such that the chamber is open to an outer surface of the substrate table at a position around the outer edge of the object, wherein, in use, the liquid has a contact angle of greater than 45° with surfaces which define the gap and face each other across the gap.

According to an aspect of the invention, there is provided a lithographic apparatus, comprising a substrate table constructed to hold a substrate; a liquid supply system configured to provide a liquid to a space between an object on the substrate table and a projection system; and a chamber in the substrate table in fluid communication with a gap surrounding, in use, an outer edge of the object such that the chamber is open to an outer surface of the substrate table at a position around the outer edge of the object, wherein, in use, the angle between surfaces defining the gap and surfaces of the chamber onto which the gap open is at least 90°.

According to an aspect of the invention, there is provided a lithographic apparatus, comprising a substrate table constructed to hold a substrate, the substrate table comprising a passage which leads to a chamber, the passage connecting the chamber to an outer surface of the substrate table and, in use, surrounds an outer edge of an object on the substrate table; and a flexible flap extendable across the passage and biased substantially to block flow of gas between the passage and the chamber and deformable by hydrostatic and/or hydrodynamic pressure from above to unblock the gap to allow passage of liquid from the passage into the chamber.

According to an aspect of the invention, there is provided a lithographic apparatus, comprising a liquid supply system configured to provide a liquid to a space between a projection system and a substrate; a first substrate table configured to hold a substrate, the first substrate table having an edge with a face with a vertical component; and a second substrate table configured to hold a substrate, the second substrate table having an edge with a face with a vertical component, wherein, in use, the liquid has a contact angle of greater than 45° with at least a portion of at least one of the faces.

According to an aspect of the invention, there is provided a device manufacturing method comprising projecting a patterned beam of radiation through a liquid onto a substrate and collecting liquid which leaks between an edge of an object and a substrate table configured to hold the substrate in a drain which is maintained at ambient pressure.

According to an aspect of the invention, there is provided a device manufacturing method comprising projecting a patterned beam of radiation through a liquid onto a substrate and collecting liquid in a chamber via a gap between an object and a substrate table configured to hold the substrate, the liquid having a contact angle of greater than 45° with surfaces which define the gap and face each other across the gap.

According to an aspect of the invention, there is provided a device manufacturing method comprising projecting a patterned beam of radiation through a liquid onto a substrate wherein liquid which leaks between an object on a substrate table configured to hold the substrate, travels along a passage and moves a flexible flap extending across an outlet of the passage to expose the liquid to a low pressure such that it is removed from the flexible flap to allow the flexible flap to re-block the passage.

According to an aspect of the invention, there is provided a device manufacturing method comprising projecting a patterned beam of radiation with a projection system through a liquid onto a substrate which is supported by a first substrate table, positioning a second substrate table next to the first substrate table and moving both substrate tables together under the projection system such that the second substrate table is moved under the projection system, wherein edges of the first and second substrate tables which are positioned next to each other during the moving each comprise a face with a vertical component, wherein the liquid has a contact angle of greater than 45° with at least a portion of at least one of the faces.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a localized area liquid supply system;

FIG. 6 illustrates, in cross-section, a drain in a substrate table according to an embodiment of the invention;

FIG. 7 illustrates, in cross-section, a drain in a substrate table according to an embodiment of the invention;

FIGS. 8a to 8e illustrate, in cross-section, variations of a drain in a substrate table according to an embodiment of the invention; and FIGS. 9a and 9b illustrate, in cross-section, a drain according to an embodiment of the present invention.

DETAILED DESCRIPTION

Figure 1:
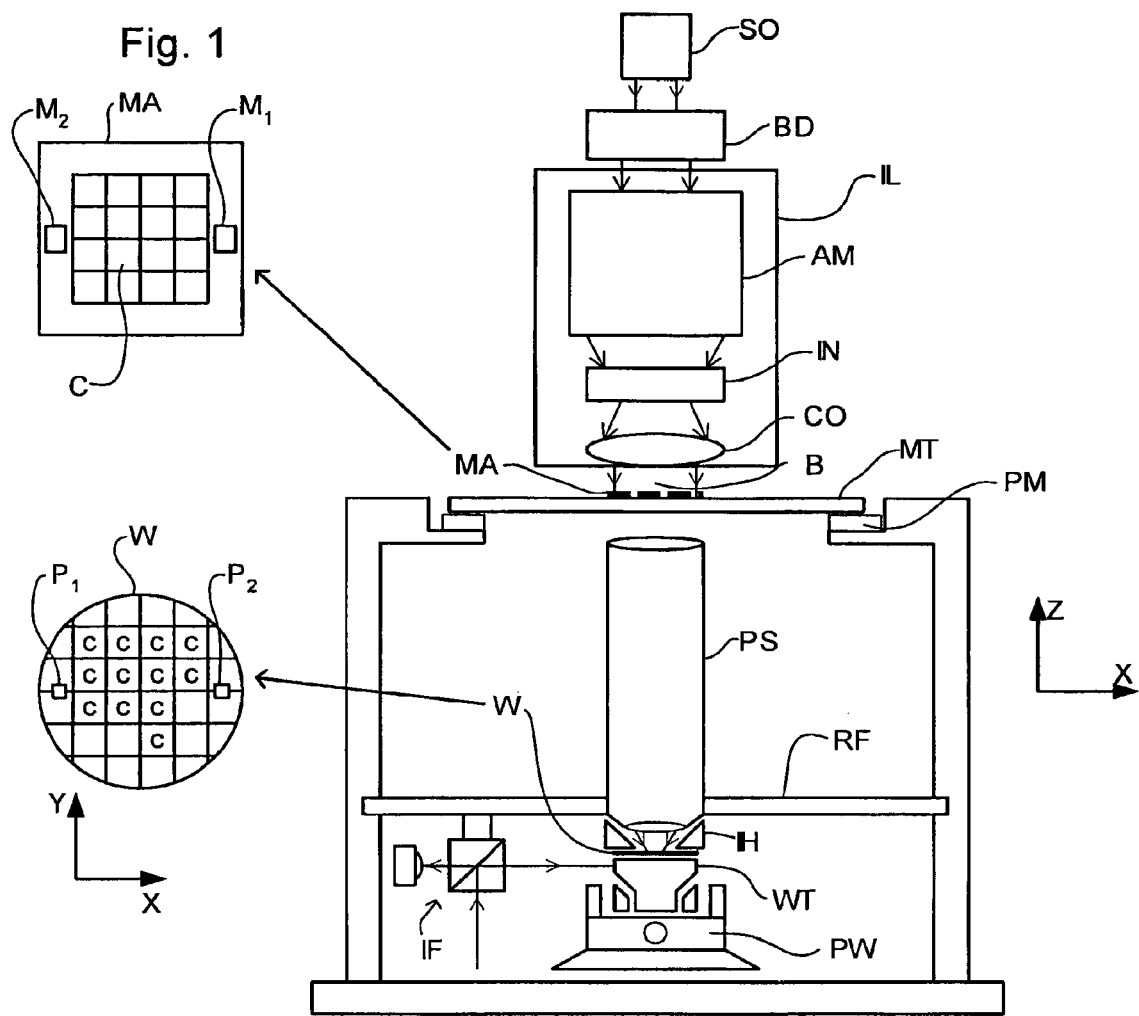
FIG. 1 depicts a lithographic apparatus according to an embodiment of the invention.
Figure 2:
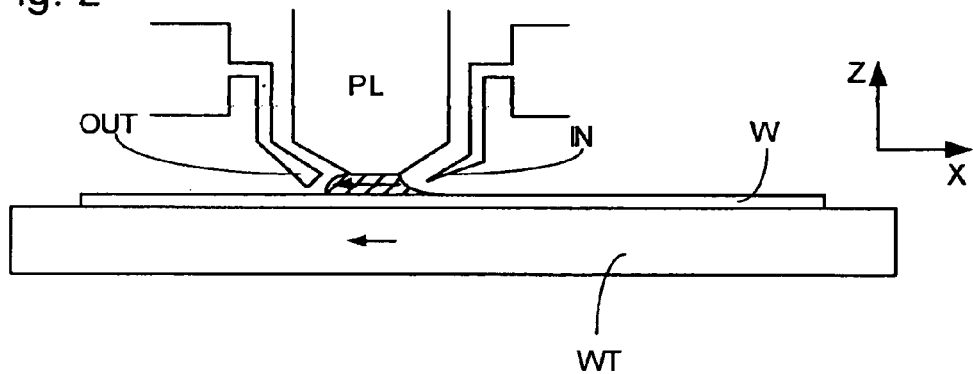
FIGS. 2 and 3 depict a liquid supply system for use in a lithographic projection apparatus.
Figure 3:
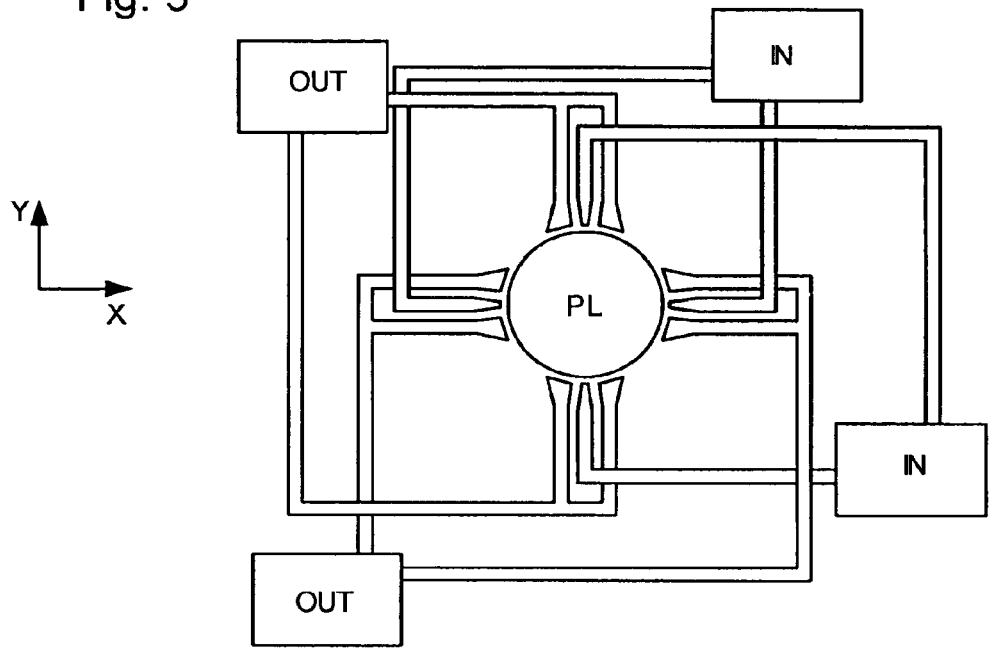
Figure 4:
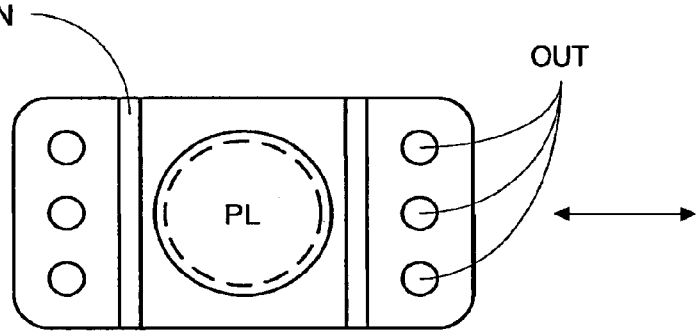
FIG. 4 depicts another liquid supply system for use in a lithographic projection apparatus.
Figure 4:
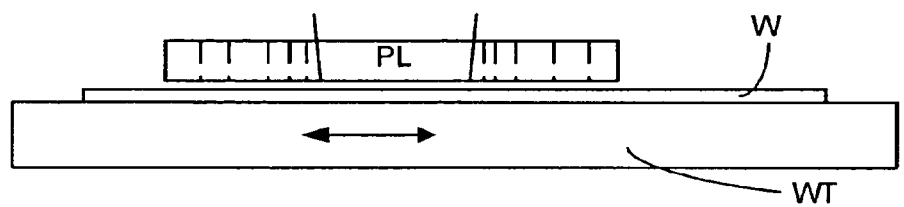

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although the present invention can be used with any type of liquid supply system, the design is optimized for use with a localized area liquid supply system such as that illustrated in FIG. 5. In this type of liquid supply system, liquid is only provided to a small area of the total top surface of a substrate at any one time. It is illustrative briefly to describe the operation of a localized area liquid supply system.

Referring to FIG. 5, the localized area liquid supply system comprises a liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

Other solutions are possible and one or more embodiments of the present invention are equally applicable to those. For example, in place of the gas seal 16 it is possible to have a single phase extractor which only extracts liquid. Radially outwardly of such a single phase extractor could be one or more features to produce a gas flow to help contain the liquid in the space. One such type of feature might be a so-called gas knife in which a thin jet of gas is directed downwards onto the substrate W. During scanning motion of the substrate under the projection system and the liquid supply system, hydrostatic and hydrodynamic forces may be generated which result in pressures on the liquid downwards towards the substrate.

With a localized area liquid supply system the substrate W is moved under the projection system PL and the liquid supply system and when an edge of the substrate W is to be imaged or when a sensor on the substrate table is to be imaged or the substrate table is to be moved such that a dummy substrate or so-called closing plate can be positioned under the liquid supply system to enable substrate swap to take place, an edge of the substrate W will pass under the space 11 and liquid may leak into the gap between the substrate W and substrate table WT. This liquid may be forced in under hydrostatic or hydrodynamic pressure or the force of a gas knife or other gas flow creating device.

Although one or more embodiments of the invention will be described below in relation to providing a drain around the edge of a substrate W, one or more embodiments are equally applicable to one or more other objects placed on the substrate table including, but not limited to, a closing plate used to maintain liquid in the liquid supply system by being attached to the bottom of the liquid supply system during, for example, substrate swap and/or one or more sensors. Thus, any reference below to the substrate W should be considered to be synonymous with any other object, such as a sensor or closing plate.

FIG. 6 illustrates an embodiment of the present invention. FIG. 6 is a cross-section through a substrate table WT and a substrate W. A drain 10 is provided around the outer edge of the substrate W where a gap 15 between the substrate W and the substrate table WT exists. In an embodiment, the drain 10 extends around the periphery of the substrate W. In an embodiment, the drain 10 may only extend around part of a periphery of the substrate W.

A substrate W is held on substrate table WT during imaging of the substrate W. The substrate W is positioned on a pimple table 20 which is a chuck with a plurality of projections 22. An under pressure generated in the gap between the substrate W and the surface of the substrate table WT between the projections 22 clamps the substrate W onto the projections 22.

In order to account for tolerances in the exact size of the substrate W and the fact that a substrate W may not be positioned perfectly centrally on the pimple table 20, the substrate table WT is constructed and arranged such that a gap/groove/passage 15 is provided between the substrate W and a top portion of the substrate table WT to account for the tolerances.

The top portion of the substrate table WT is constructed and arranged such that its top surface will be substantially parallel and co-planar with the top surface of the substrate W when the substrate W is placed on the substrate table WT. This is to ensure that when an edge of the substrate W is being imaged or when the substrate table WT passes under the projection system to bring the substrate W under the projection system for the first time or to move the substrate W out from under the projection system following imaging, and the liquid supply system must pass from the top surface of the substrate table WT to the top surface of the substrate W or vice versa, leaking of liquid into gap 15 will be reduced or minimized. However, some liquid will inevitably enter the gap 15.

In an embodiment, the gap 15 is provided with a low pressure source in order to remove liquid which enters the gap 15. However, the low pressure source may create a flow of gas across the edge of the substrate W when the edge of the substrate W is not being imaged and is therefore not covered in liquid. This flow of gas may cause localized cooling of the substrate W which is deleterious.

In an embodiment, no liquid removal device may be provided to remove liquid from the gap 15 (for example, the gap may be blocked with a pliant material). Although this overcomes the problem of localized cooling of the substrate W, unfortunately this may lead to the inclusion of bubbles in the liquid in the liquid supply system (as the gap passes under the liquid supply system) thereby possibly introducing imaging errors. Furthermore or alternatively, contact between a (solid) seal member and the substrate W is desirably avoided as there is a danger of substrate damage and/or particle generation.

One or more embodiments are directed to alleviating one or more of these problems or other problems. One or more embodiments have an advantage of reducing the amount of liquid lost from the liquid supply system through the gap 15.

The construction of the drain 10 will now be described in detail with reference to FIG. 6. In FIG. 6 the gap or passage or groove 15 has two distinct vertical elements. The top element of the gap is defined between the substrate W and the top portion of the substrate table WT. The narrowest part of the gap 15 which is the lower element is defined between two projections 40, 60 of the substrate table WT. The radially inward projection 40 extends radially outwardly from or under the pimple table 20 such that its edge is substantially vertically aligned with the edge of the substrate W. However, the edge of the projection 40 may either be radially inwardly or radially outwardly of the substrate W. The outer projection 60 projects radially inwardly further inwards than the top portion of the substrate table WT but again this is not necessarily the case and it could project less. Indeed, the outer projection 60 could be missing and the top portion of the substrate table WT could extend downwards to form the projection. Thus, each side of the gap 15 is defined by one projection of the substrate table WT.

The gap or passage or groove 15 brings a chamber 70 into fluid communication with the atmosphere above the substrate table WT. In an embodiment, a line can be drawn straight from outside of the substrate table WT through the gap 15 between projections 40, 60 into the chamber 70. In an embodiment, that line is a vertical line and/or intercepts the boundary of the chamber 70 on the bottom wall 72 of the chamber 70. If the dimensions of the gap 15 and chamber 70 are correctly chosen this arrangement has an advantage of meaning that a gas knife which may be used in the liquid supply system in order to help contain liquid within the space is not influenced by the presence of the gap 15, because the gas knife does not "feel" the bottom of the chamber 70. In order for this effect (or more precisely lack of effect) to be present, the bottom 72 of the chamber 70 should be at least 1 mm, at least 2 mm, at least 3 mm, at least 4 mm or at least 5 mm from the top surface of the substrate table WT.

In the drain of FIG. 6, the pressure of gas in the chamber 70 is maintained at the same pressure as gas outside of the substrate table WT (i.e. ambient gas pressure). This means that there is, in normal operation, substantially no gas flow through the gap 15 when the gap 15 is not covered by the liquid supply system and one or more gas flow devices of the liquid supply system are blowing gas through the gap 15. Even if the liquid supply system covers part of the gap 15 (the gap 15 surrounding the periphery of the substrate W and the liquid supply system providing liquid to a space which is far smaller than the top surface area of the substrate W) ambient pressure will still be maintained in the chamber 70 because the chamber 70 is annular (or other shape) and will be open to the atmosphere above the substrate table WT through the gap 15 at another location around the periphery of the substrate W.

In order to remove liquid from the chamber 70, a liquid removal device is employed which does not create an under-pressure in the chamber 70. In an embodiment, the liquid removal device does not substantially create a gas flow in the chamber 70. For example, the liquid removal device could be a passive liquid removal device using, for example, capillary action in a capillary passage 80 for the removal of liquid. If the immersion liquid has a contact angle of less than 90°, or less than 80°, 70°, 60°, 50°, 40°, 30°, or 20° with the inner surface of the capillary passage 80, removal of liquid sitting on the bottom 72 of the chamber 70 should be greatly enhanced. One or more other liquid removal devices may be usable, for example one which only applies an under pressure to passage 80 when the presence of liquid at the mouth of the passage 80 in the chamber 70 is detected or a microsieve single phase extractor (see European patent application publication EP 1,628,163 for example). In another way, one part of an embodiment of the invention may be seen as not using active suction to remove liquid from the gap 15 (and chamber 70), particularly when no liquid is present.

In use, it is possible to make the gap 15 small enough such that surface tension of the immersion liquid means that the immersion liquid will bridge the gap between the substrate W and the substrate table WT when the gap 15 traverses the edge of the barrier member of the liquid supply system. However, hydrostatic and/or hydrodynamic pressures in use and/or pressures due to scanning movement may mean that the surface tension of the liquid is not enough to prevent liquid from entering the gap 15 and passing between projections 40, 60 into chamber 70. However, because the liquid is removed from the chamber 70 in a passive manner without creating an under pressure in the chamber 70, single phase extraction of liquid from the gap into the chamber 70 is possible such that bubbles are unlikely to be introduced into the liquid in the space. In other words, liquid will simply flow into the gap 15 and fill the gap before dripping into the chamber 70 and any gas in the gap 15 will be either forced into the chamber 70 or forced out sideways along the gap 15.

Because no under pressure is applied to the chamber 70 the rate of liquid loss through the groove or passage or gap 15 should be vastly reduced over the case when an under pressure is applied to the chamber 70.

In order to reduce the flow of liquid through the gap 15, the surface properties of the faces defining the gap and facing each other (which are labelled 42, 62) may be specifically configured. For example, if the immersion liquid (e.g. ultra pure water (UPW)) has a contact angle of greater than 45° with the surfaces of those faces 42, 62 under the operating conditions in the lithographic apparatus e.g. of intense UV radiation and UPW flow (i.e. those faces are mildly hydrophobic under the operating conditions) the strength of any meniscus of liquid extending between those two surfaces will often be high enough to overcome the hydrostatic and hydrodynamic forces of the liquid above the meniscus. In an embodiment, the immersion liquid has a contact angle of greater than 70°, 80°, or 90° with the surfaces which define the gap and face each other across the gap. In an embodiment, the faces 42, 62 define the narrowest part of the gap 15.

The strength of the meniscus may also be increased by changing the geometry of the faces 42, 62. If the shape of those faces is changed to enhance capillary action the need to ensure that the immersion liquid has a contact angle of greater than 45° with the surfaces of those faces may be reduced. As is illustrated in dotted lines in FIG. 6, if the lower edges of the gap 15 are provided as sharp edges (e.g. the walls of the gap meet the walls of the chamber at an angle of greater than 90°, greater than 100° or greater than 110°) a capillary lock may be formed. Some other solutions to reduce liquid loss are illustrated in FIG. 8.

Some liquid may leak through in certain circumstances, for example when the gap 15 passes under the edge of the barrier member liquid will be left in the gap 15. The gap 15 may then pass under a gas knife which may be part of the liquid supply system blowing on top of the liquid in the gap and causing it to drop into the chamber 70. Actually this process may be beneficial because it means that the gap is completely cleared such that the next time the gap 15 at that point along the gap passes under the space 11 of immersion liquid the liquid may fill the gap 15 with a reduced danger of gas in the gap finding its way as bubbles into the immersion liquid in the space (because any gas can escape and is not confined by liquid droplets in the gap). The hydrostatic and scanning pressures induced in the immersion liquid may ensure the proper flow direction of liquid through the gap 15 avoiding bubbles to form and rise into the space. Also, the liquid may be cleared from the gap by the gas knife without flowing back onto the substrate and substrate table. Splashing and associated defects may be avoided in this way.

As illustrated in FIG. 6, the projections 40, 60 defining the gap 15 are illustrated with convex faces 42, 62 facing each other. Thus, the projections 40, 60 define the narrowest portion of the gap 15 at a mid portion or point between those two projections. Other shapes may be possible including, but not limited to the shape illustrated in FIG. 8.

One or more embodiments of invention may also be applicable to the way in which a gap between two substrate tables WT may be bridged during substrate swap without the use of a closing plate. In this method two substrate tables are moved close together and then moved together under the projection system such that the liquid supply system "moves" from one substrate table to the other. In this case the edge of the substrate W illustrated in FIG. 6 is replaced by the edge of a first substrate table WT1 such that this first substrate table WT1 provides the projection 40 on the left hand side of FIG. 6 and a second substrate table WT2 provides the protrusion 60 on the right hand side of FIG. 6. In an embodiment, some sort of drain would be attached to one or other or both of the substrate tables WT1, WT2 but because the drain (which is replacing the chamber 70) is at atmospheric pressure, this does not present a problem.

In an embodiment, the dimensions of the chamber 70 are that it should be at least twice as wide as the gap 15 in order to ensure that any liquid which does enter the gap 15 does not travel too far past the substrate W without first breaking up. Arranging for the transition of the width of the gap 15 to the width of the chamber 70 to be large and sudden ensures that the liquid meniscus which bridges between the projections 40, 60 is desirably broken at that point such that liquid will flow into the chamber 70 and drip onto the bottom surface 72 where it can be removed by the liquid removal device 80. In an embodiment, the chamber or groove is at least 1 mm wider than the gap 15.

As is illustrated in FIG. 6, the gap 15 is positioned over the center of the chamber 70. This is not necessarily the case and the gap 15 may be positioned anywhere along the width of the chamber 70 from the extreme left hand side to the extreme right hand side (the innermost and outermost sides) as illustrated in FIG. 6.

FIG. 7 illustrates an embodiment of the present invention which is the same as the embodiment described above with respect to FIG. 6 except as described below. In this embodiment, the narrowest point of the gap 15 is defined by the distance between the edge of the substrate W and the top portion of the substrate table WT. Thus the projections 40, 60 of the first embodiment are not present and are replaced by the edge of the substrate W and top portion of the substrate table WT respectively (i.e., these form respectively the projections 40, 60). A material used for a substrate table WT is normally hydro or liquid-philic meaning that the immersion liquid has a contact angle of less than 90° with a surface of the substrate table WT. In an embodiment, the edge of the substrate W may be made to be hydro or liquid phobic (i.e. the immersion liquid has a contact angle of greater than 90° with the surface) and the same can be done for the edge of the substrate table WT which defines the other side of the gap 15. This is similar to what is described above.

FIG. 8 illustrates an embodiment which is the same as the embodiment described above with respect to FIG. 7 except as described below. This embodiment is optimized for low liquid consumption. Because the gap in FIG. 7 cannot be reduced any more (because of substrate dimensional tolerances) a different projection shape is chosen (FIG. 8a) so as to minimize the width of the gap 15 while still enabling suitable substrate table tolerances for variations in substrate size.

In the FIG. 8a embodiment, the convex surface of at least one of the two projections is replaced by a concave surface. The concave surface is nearest to the other side of the gap nearest to the chamber 70. In this way, because of the curvature of the edge of the substrate W itself, the substrate W can get closer to the projection thereby narrowing the gap. A shorter meniscus is thereby needed to bridge the gap between the substrate W and substrate table WT. A shorter meniscus is stronger than a long one.

FIGS. 8b-8e illustrate other measures which may be taken to narrow the gap without unnecessarily impeding the path for the gas of the gas knife of the liquid confinement structure 12 i.e. the "bottomless" character of the drain which means that the gas knife does not "feel" the bottom of the chamber 70. In these embodiments at least one divider is positioned in the chamber 70 under the gap 15 to split the opening of the gap into the chamber into two or more gaps.

In the embodiment illustrated in FIG. 8b, a bar 200 is positioned under the gap 15, in an embodiment along the entire length of the gap 15 such that the bar 200 is an annulus (or other peripheral shape). The bar 200 splits the gap 15 into two parts such that two shorter meniscuses would be present, one between the bar and the substrate W or the substrate table WT directly under the substrate W, and one between the bar 200 and the substrate table WT on the right hand side of the bar 200, as illustrated in FIG. 8b. However, the bottomless character of the drain is not impeded because gas from a gas knife would easily pass either side of the bar 200 into the chamber 70.

The embodiment of FIG. 8c is similar to that of the embodiment of FIG. 8b except that the bar 200 has been replaced by a series of vanes 210. These vanes or fins 210 are arranged such that they form a plurality of gaps or passages between each other from the gap 15 into the chamber 70. Thus, the fins 210 may be seen as elongate structures in cross-section which have a length which, in an embodiment, extends all along the bottom of the gap 15 to form several annuli (or other peripheral shapes). Four fins 210 are illustrated. However, the skilled person will appreciate that any number could be provided. The fins split up the width of the gap 15 into several smaller gaps across which the liquid meniscus needs to bridge.

The embodiment in FIG. 8d illustrates a further idea in which a mesh 220 is placed under the gap 15 such that it bridges the gap between the substrate table WT on the left hand side of the gap 15 and the substrate table WT on the right hand side of the gap 15. Again, in an embodiment, it extends all around the gap 15. The grid or gauze or mesh 220 presents the liquid with many gaps across which a meniscus must bridge thereby providing many narrow gaps for the liquid to pass through. However, even such a grid or gauze or mesh would not present much resistance to flow of gas through it.

FIG. 8e shows another embodiment in which the gap is split into two. In this case a single plate 230 is placed in the center of the gap thereby to split up the gap into two and reduce the width across which liquid must bridge. In the embodiment of FIG. 8e only a single plate is provided which is given a thickness (in contrast to the embodiment illustrated in FIG. 8c with a plurality of fins). In the embodiment of FIG. 8e the plate 230 is shown as being vertical. However, the plate 230 does not necessarily need to be vertical and it could be angled in the same way as some of the fins 210 in the embodiment of FIG. 8c.

FIGS. 9a-b illustrate an embodiment which is the same as the embodiment described above with respect to FIG. 6 except as described below. In this embodiment, a flap 100 is provided to seal the entrance of the gap 15 to the chamber 70. In FIG. 9a the gap 15 is illustrated as being a tortuous path from the edge of the substrate W into the chamber 70. However, a gap 15 as illustrated in FIG. 6, 7 or 8 may also be employed in this present embodiment.

The flap 100, which is a flexible flap, extends along the entire periphery of the gap 15. The flap 100 is attached to the substrate table at either its inner most or outer most edge. In this embodiment an active liquid removal device is provided such that the chamber 70 is held at an under pressure in which the pressure is lower than the ambient pressure. In order to avoid a flow of gas across the surface of the edge of the substrate W when the liquid supply device is not positioned at that point along the gap 15, the flap is biased such that it covers the entrance of the gap 15 into the chamber 70. When liquid enters the gap 15, and is forced along the gap 15 onto the flap 100, the material properties of the flap and dimensions of the flap 100 are chosen such that the weight and/or hydrodynamic pressure of the liquid on top of the flap will force the flap downwards at the edge at which it is not attached to the substrate table (as is illustrated in FIG. 9b) so that liquid can flow into the chamber 70 where it is sucked away by the active liquid removal device. Clearly once all the liquid is removed, the flap 100 will move back to the position where it is blocking the passage 15 into the chamber 70 due to being biased in that direction.

Once the flap has been moved away from sealing the gap as illustrated in FIG. 9b, the liquid whose weight and/or hydrodynamic pressure forced the flap 100 to open will be exposed to the under pressure in the chamber 70 and will be sucked into the chamber 70 and removed from the chamber 70 by the active liquid removal device 180.

Thus, in this embodiment flow of gas over the edge of the substrate may prevented.

In an embodiment, there is provided a lithographic apparatus, comprising: a substrate table constructed to hold a substrate; a liquid supply system configured to provide a liquid to a space between an object on the substrate table and a projection system; and a drain in the substrate table configured to contain liquid which leaks, in use, between an edge of the object and the substrate table, wherein, in use, pressure of gas in the drain is maintained to be substantially equal to ambient pressure of gas above the substrate table.

In an embodiment, in use, the drain is constructed and arranged never to be full of liquid. In an embodiment, the apparatus further comprises a liquid removal device in the drain configured to remove liquid from the drain. In an embodiment, the liquid removal device is a passive liquid removal device. In an embodiment, the passive liquid removal device comprises a capillary channel. In an embodiment, the drain comprises a chamber which is open to a top surface of the substrate table via a gap, the gap extending, in use, around the periphery of the object. In an embodiment, the apparatus further comprises a divider positioned in the drain beneath the gap to split an opening of the gap into the drain into at least two. In an embodiment, the divider comprises a mesh. In an embodiment, the divider comprises a plurality of substantially downwardly extending fins. In an embodiment, a direct vertical path leads from outside of the substrate table, through the gap into the drain. In an embodiment, the drain and the gap have a height and the height of the drain and the gap is such that the bottom of the drain is at least 1 mm from a top surface of the substrate table. In an embodiment, the drain is at least 1 mm wider than the gap. In an embodiment, in use, liquid enters the drain through the gap and the liquid has a contact angle of greater than 90° with surfaces of faces of the gap which oppose each other. In an embodiment, the faces define the narrowest portion of the gap. In an embodiment, the faces are convex such that the gap narrows in a middle portion. In an embodiment, one of the faces is a surface of the object. In an embodiment, the other face is concave and wherein the gap is narrowest at the entrance to the drain. In an embodiment, in use, there is substantially no flow of gas into the drain through the gap.

In an embodiment, there is provided a lithographic apparatus, comprising: a substrate table constructed to hold a substrate; a liquid supply system configured to provide a liquid to a space between an object on the substrate table and a projection system; and a chamber in the substrate table in fluid communication with a gap surrounding, in use, an outer edge of the object such that the chamber is open to an outer surface of the substrate table at a position around the outer edge of the object, wherein, in use, the liquid has a contact angle of greater than 45° with surfaces which define the gap and face each other across the gap.

In an embodiment, in use, the liquid has a contact angle of greater than 70° with the surfaces which define the gap and face each other across the gap. In an embodiment, the surfaces are convex such that the gap has a narrowing in a central portion. In an embodiment, the chamber has a width at least 1 mm wider than that of the gap. In an embodiment, the chamber has a height at least twice that of the gap.

In an embodiment, there is provided a lithographic apparatus, comprising: a substrate table constructed to hold a substrate; a liquid supply system configured to provide a liquid to a space between an object on the substrate table and a projection system; and a chamber in the substrate table in fluid communication with a gap surrounding, in use, an outer edge of the object such that the chamber is open to an outer surface of the substrate table at a position around the outer edge of the object, wherein, in use, the angle between surfaces defining the gap and surfaces of the chamber onto which the gap open is at least 90°.

In an embodiment, the angle is at least 100°.

In an embodiment, there is provided a lithographic apparatus, comprising: a substrate table constructed to hold a substrate, the substrate table comprising a passage which leads to a chamber, the passage connecting the chamber to an outer surface of the substrate table and, in use, surrounds an outer edge of an object on the substrate table; and a flexible flap extendable across the passage and biased substantially to block flow of gas between the passage and the chamber and deformable by hydrostatic and/or hydrodynamic pressure from above to unblock the gap to allow passage of liquid from the passage into the chamber.

In an embodiment, the flexible flap extends across two parts of the substrate table. In an embodiment, the apparatus further comprises a low pressure outlet configured to remove liquid from the chamber. In an embodiment, the flexible flap comprises a perimeter of material flexible enough so that local regions along its length are deformable to allow local passage of liquid from the passage into the chamber.

In an embodiment, there is provided a lithographic apparatus, comprising: a liquid supply system configured to provide a liquid to a space between a projection system and a substrate; a first substrate table configured to hold a substrate, the first substrate table having an edge with a face with a vertical component; and a second substrate table configured to hold a substrate, the second substrate table having an edge with a face with a vertical component, wherein, in use, the liquid has a contact angle of greater than 45° with at least a portion of at least one of the faces. In an embodiment, each face is part of a projection and forms an outer most boundary of the respective substrate table.

In an embodiment, there is provided a device manufacturing method comprising projecting a patterned beam of radiation through a liquid onto a substrate and collecting liquid which leaks between an edge of an object and a substrate table configured to hold the substrate in a drain which is maintained at ambient pressure.

In an embodiment, there is provided a device manufacturing method comprising projecting a patterned beam of radiation through a liquid onto a substrate and collecting liquid in a chamber via a gap between an object and a substrate table configured to hold the substrate, the liquid having a contact angle of greater than 45° with surfaces which define the gap and face each other across the gap.

In an embodiment, there is provided a device manufacturing method comprising projecting a patterned beam of radiation through a liquid onto a substrate wherein liquid which leaks between an object on a substrate table configured to hold the substrate, travels along a passage and moves a flexible flap extending across an outlet of the passage to expose the liquid to a low pressure such that it is removed from the flexible flap to allow the flexible flap to re-block the passage.

In an embodiment, there is provided a device manufacturing method comprising projecting a patterned beam of radiation with a projection system through a liquid onto a substrate which is supported by a first substrate table, positioning a second substrate table next to the first substrate table and moving both substrate tables together under the projection system such that the second substrate table is moved under the projection system, wherein edges of the first and second substrate tables which are positioned next to each other during the moving each comprise a face with a vertical component, wherein the liquid has a contact angle of greater than 45° with at least a portion of at least one of the faces.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a table;
   a liquid supply system configured to provide a liquid to a space between an object on the table and a projection system; and
   a drain in the table, the drain configured to remove liquid and extending around at least part of a periphery of the object, the drain comprising:
      a chamber,
      a gap arranged to bring the chamber into fluid communication with an atmosphere above the table, and
      a seal arranged to seal an opening of the chamber and configured to be opened, from being sealed so that essentially no liquid passes through the opening, by liquid in the gap to allow liquid to pass through the opening.

2. The lithographic apparatus of claim 1, further comprising an active liquid removal device to remove liquid from the chamber.

3. The lithographic apparatus of claim 2, wherein the active liquid removal device is configured to hold the pressure in the chamber at a pressure that is lower than an ambient pressure.

4. The lithographic apparatus of claim 1, further comprising a passive liquid removal device to remove liquid from the chamber.

5. The lithographic apparatus of claim 4, wherein the passive liquid removal device comprises a capillary passage.

6. The lithographic apparatus of claim 5, wherein a surface of the capillary passage has a contact angle of less than 90° with the liquid.

7. The lithographic apparatus of claim 1, wherein the seal is configured to be opened by a hydrodynamic pressure of the liquid.

8. The lithographic apparatus of claim 1, wherein the seal is configured to be opened by a weight of the liquid.

9. The lithographic apparatus of claim 1, wherein the seal comprises a flexible flap.

10. The lithographic apparatus of claim 1, wherein the seal is biased such that the seal covers the opening of the chamber.

11. The lithographic apparatus of claim 1, wherein the seal is attached to the table at an edge of the seal.

12. The lithographic apparatus of claim 11, wherein the object is a radiation-sensitive substrate.

13. The lithographic apparatus of claim 1, wherein the object is a sensor.

14. The lithographic apparatus of claim 1, wherein the table is a substrate table to hold a radiation-sensitive substrate.

15. The lithographic apparatus of claim 1, wherein the seal is configured to move at least partially in a vertical direction when opened by liquid in the gap.

16. A lithographic apparatus, comprising:
   a table;
   a liquid supply system configured to provide a liquid to a space between an object on the table and a projection system; and
   a drain in the table, the drain configured to remove liquid and comprising:
      a chamber,
      a gap, above the chamber, arranged to bring the chamber into fluid communication with an atmosphere above the table, and
      a mesh provided in an opening of the chamber, the mesh vertically spaced apart from and below the top of the gap.

17. The lithographic apparatus of claim 16, wherein the mesh extends all around the gap.

18. The lithographic apparatus of claim 16, wherein the mesh provides narrow gaps for the liquid to pass through.

19. The lithographic apparatus of claim 16, wherein the mesh is provided in the opening to the chamber between the gap and the chamber.

20. A device manufacturing method comprising:
   projecting a patterned beam of radiation through a liquid onto a substrate;
   collecting liquid which leaks between an edge of an object and a table holding the object in a drain, the drain extending around at least part of a periphery of the object, the drain comprising a chamber and a gap bringing the chamber into fluid communication with an atmosphere above the table;
   sealing an opening of the chamber; and
   opening the seal to the opening of the chamber, from being sealed so that essentially no liquid passes through the opening, by using liquid in the gap to allow liquid to pass through the opening.

21. A device manufacturing method comprising:
   projecting a patterned beam of radiation through a liquid onto a substrate;
   collecting liquid which leaks between an edge of an object and a table holding the object in a drain, the drain comprising a chamber and a gap, above the chamber, bringing the chamber into fluid communication with an atmosphere above the table, wherein the collected liquid passes into the chamber via a mesh provided in an opening to the chamber, the mesh vertically spaced apart from and below the top of the gap.

22. A lithographic apparatus, comprising:
   a table;
   a liquid supply system configured to provide a liquid to a space between an object on the table and a projection system; and
   a drain in the table, the drain configured to remove liquid and comprising:
      a chamber having a first opening and having a second opening below the first opening,
      a gap between the object when on the table and the table, the gap arranged to bring the chamber, via the first opening, into fluid communication with an atmosphere above the table, and
      a porous structure to allow fluid therethrough, the porous structure located between the gap and the second opening of the chamber and the porous structure vertically spaced apart from and below the top of the gap.

23. The lithographic apparatus of claim 22, wherein the porous structure is provided in the first opening of the chamber.

24. The lithographic apparatus of claim 23, wherein the first opening of the chamber is in a horizontal surface of the table, the surface being below the object when on the table.

25. The lithographic apparatus of claim 22, wherein a cross-sectional width of the first opening of the chamber is smaller than a cross-sectional width of the chamber, and the porous structure extends across the first opening.

26. The lithographic apparatus of claim 22, wherein the porous structure is located below a bottom surface of the object and underneath the gap.

27. The lithographic apparatus of claim 22, wherein the second opening of the chamber connects to a conduit that extends substantially horizontally in the table.

* * * * *